(12) United States Patent
Althoefer et al.

(10) Patent No.: US 10,900,914 B2
(45) Date of Patent: Jan. 26, 2021

(54) AUTHENTICATING AN ARTICLE (71) Applicant: KING'S COLLEGE LONDON, London (GB)

(72) Inventors: Kaspar Althoefer, London (GB); Jamie Barras, London (GB); David Nugent, Great Cambourne (GB)

(73) Assignee: KING'S COLLEGE LONDON

( * ) Notice: Subject to any disclaimer, the term of this patent is extended or adjusted under 35 U.S.C. 154(b) by 279 days.

(21) Appl. No.: 15/534,966

(22) PCT Filed: Dec. 11, 2015

(86) PCT No.: PCT/GB2015/053890
§ 371 (c)(1),
(2) Date: Jun. 9, 2017

(87) PCT Pub. No.: WO2016/092328
PCT Pub. Date: Jun. 16, 2016

(65) Prior Publication Data
US 2017/0343496 A1 Nov. 30, 2017

(30) Foreign Application Priority Data

Dec. 11, 2014 (GB) .................................. 1422077.6

(51) Int. Cl.
*G01N 24/00* (2006.01)
*G07D 7/06* (2006.01)
(Continued)

(52) U.S. Cl.
CPC ........... *G01N 24/008* (2013.01); *G01N 24/00* (2013.01); *G01R 33/441* (2013.01); *G07D 7/06* (2013.01)

(58) Field of Classification Search
CPC .... G01N 24/00; G01N 24/008; G01R 33/441; G07D 7/004; G07D 7/06; G07D 7/20;
(Continued)

(56) References Cited

U.S. PATENT DOCUMENTS 6,746,053 B1 * 6/2004 Afzali-Ardakani ..........................
G06K 19/06028
206/459.5
8,712,856 B2 * 4/2014 Junger ................. G06Q 20/208
705/23

(Continued)

FOREIGN PATENT DOCUMENTS

EP 2778705 A1 9/2014
WO WO-96/05522 A2 2/1996
(Continued)

OTHER PUBLICATIONS

J. Lužnik, et al. "The Influence of Pressure in Paracetamol Tablet Compaction on $^{14}$N Nuclear Quadrupole Resonance Signal." Applied Magnetic Resonance (2013) 44 (pp. 735-743) (9 pages).
(Continued)

*Primary Examiner* — Neel D Shah
(74) *Attorney, Agent, or Firm* — Harness, Dickey & Pierce, P.L.C.

(57) ABSTRACT

A method of authenticating an article, the method comprising: reading a label associated with the article, the label comprising article fingerprint information; retrieving, in dependence on the article fingerprint information, an article fingerprint, the fingerprint describing the resonance response of the article to an excitation signal; applying an excitation signal to the article; receiving the resonance response of the article to the excitation signal; comparing the resonance response to the fingerprint; and determining in dependence on the comparison whether the article is authentic.

16 Claims, 10 Drawing Sheets

(51) Int. Cl.
*G06F 21/32* (2013.01)
*G01R 33/44* (2006.01)

(58) Field of Classification Search
CPC .... G06Q 10/08; G06Q 10/087; G06Q 30/018; G06F 19/34; G06F 19/3456; G06F 19/3462; G06F 19/3475; G06F 21/32; G06F 16/9554
See application file for complete search history.

(56) References Cited

U.S. PATENT DOCUMENTS

| | | | |
|---|---|---|---|
| 2003/0030558 A1 | 2/2003 | Stevenson et al. | |
| 2006/0226838 A1 | 10/2006 | Smith et al. | |
| 2007/0036470 A1 | 2/2007 | Piersol et al. | |
| 2009/0160654 A1* | 6/2009 | Yang | B29B 9/12 340/572.9 |
| 2014/0266202 A1* | 9/2014 | Rozenfeld | G01R 33/44 324/310 |

FOREIGN PATENT DOCUMENTS

| | | |
|---|---|---|
| WO | WO-97/24699 A1 | 7/1997 |
| WO | WO-2005/104016 A1 | 11/2005 |
| WO | WO-2006/122355 A1 | 11/2006 |
| WO | WO-2008/127694 A1 | 10/2008 |

OTHER PUBLICATIONS

Jamie Barras, et al. "Nitrogen-14 Nuclear Quadrupole Resonance Spectroscopy: A Promising New Analytical Methodology for Medicines Authentication and Counterfeit Antimalarial Analysis." ACS Publications, Analytical Chemistry, 2013, 85 (pp. 2746-2753) (8 pages).
International Search Report and Written Opinion of the International Searching Authority issued in PCT/GB2015/053890, dated Jun. 3, 2016, ISA/EPO.
GB Search Report of the Intellectual Property Office under Section 17 issued in application No. GB1422077.6, dated Feb. 26, 2016.

* cited by examiner

QR Fingerprint Generate

Box 1

Box 2

Fig. 11

AUTHENTICATING AN ARTICLE

CROSS REFERENCE TO RELATED APPLICATIONS

This application is a U.S. National Phase Application under 35 U.S.C. 371 of International Application No. PCT/GB2015/053890 filed on Dec. 11, 2015 and published in English as WO 2016/092328 A2 on Jun. 16, 2016. This application is based on and claims the benefit of priority from Great Britain Patent Application No. 1422077.6 filed Dec. 11, 2014. The entire disclosures of all of the above applications are incorporated herein by reference.

The present invention relates to a method and an apparatus for authenticating an article. The invention has particular relevance to, but is not limited to, the authentication of medicines and the detection of counterfeit or falsified pharmaceuticals.

Counterfeiting and falsification is widespread in many industries. This is especially so in the pharmaceutical industry, where there is a serious concern, particularly in the developing world, that the contents of a package purporting to contain a medicine do not always match what is indicated on the label. Ideally, a method for detecting counterfeit or falsified medicines would be useable in the field by medical staff, customs and law enforcement officials rather than being reliant on samples being sent away for laboratory analysis.

What is required is a medicine authentication (or counterfeit/falsification detection) method and apparatus which is sensitive, secure and robust.

Nuclear Quadrupole Resonance (NQR or OR) has previously been used as an analytical technique for the study of medicines, including the identification of counterfeits, where it been shown to be sensitive to both extrinsic as well as intrinsic characteristics of medicines, ie. to both the processes used during manufacture as well as to the chemical composition or crystal structure.

FIG. 1 shows examples of research results indicating the suitability of NQR for detecting counterfeit medicines.

Figure 1A:
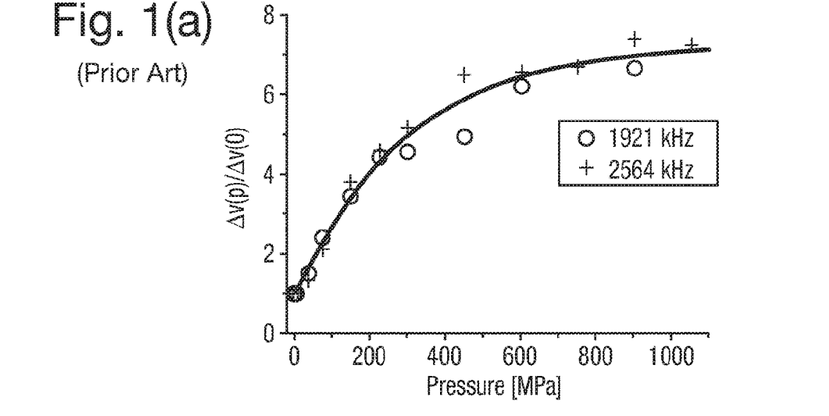
FIG. 1 shows examples of research results indicating the suitability of NQR for detecting counterfeit medicines.

FIG. 1a shows how NQR may be used to differentiate between pills of the same medicine produced in different ways. In this example, different amounts of pressure were applied during pill formation, and this is reflected in the different relative $^{14}$N NQR $v^+$ and $v^-$ linewidths in paracetamol when plotted versus the compacting pressure of tablet preparation. (From Lužnik et al, "The Influence of Pressure in Paracetamol Tablet Compaction on $^{14}$N Nuclear Quadrupole Resonance Signal", Applied. Magnetic Resonance (2013) 44: 735-743.

Figure 1B:
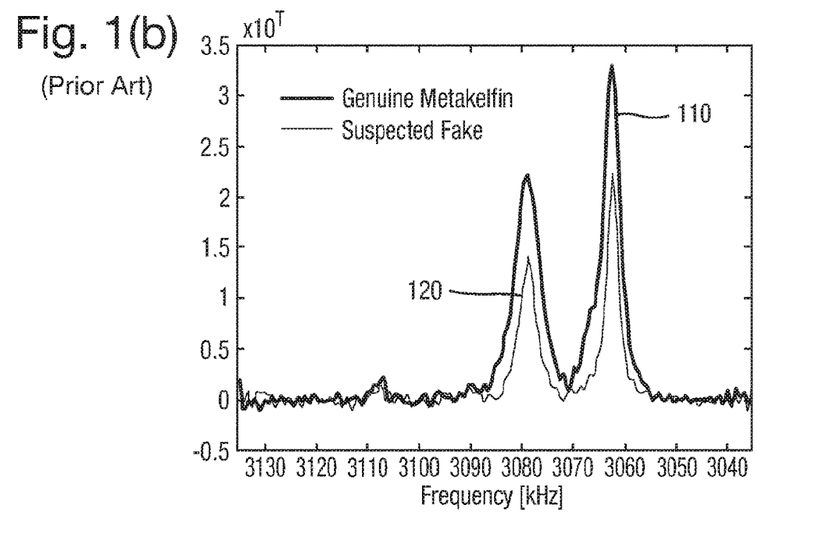

FIG. 1b shows how NQR may be used to differentiate between medicines with different amounts of active ingredient. In this example, an NQR response 110 from a known sample of the antimalarial drug Metakelfin™, which contains sulfalene and pyrimethamine, is compared to that from a suspected counterfeit 120. The results show that despite some sulfalene being present in the counterfeit, the amount is too little for it to be the genuine medicine. (From Barras et al, "Nitrogen-14 Nuclear Quadrupole Resonance Spectroscopy: a promising new analytical methodology for medicines authentication and counterfeit antimalarial analysis", Analytical Chemistry, 2013, 85, 2746-2753).

Figure 1C:
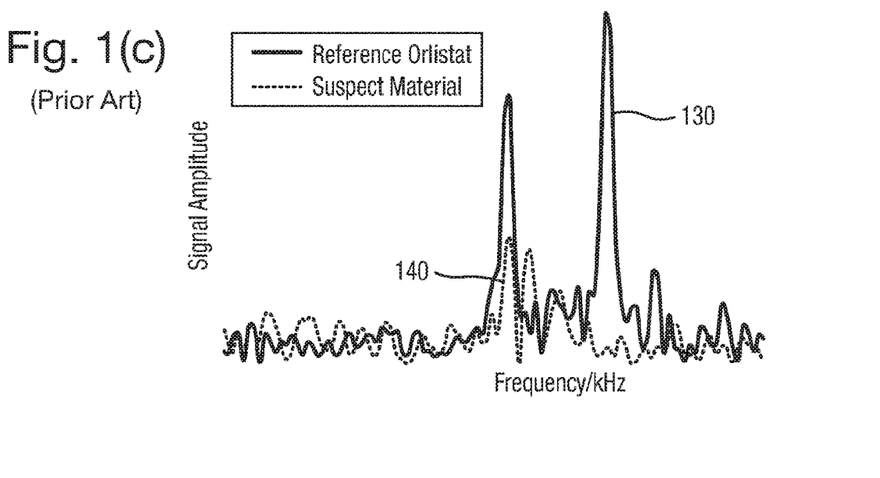

FIG. 1c shows a further example of the use of NQR to identify a counterfeit medicament, in this case for the slimming drug Orlistat™. The NQR response of a sample material 140 which was being sold as "Orlistat" is clearly different to that of genuine Orlistat™ 130 indicating it is counterfeit (a result confirmed by mass spectroscopy and NMR measurements).

While the above examples show that NQR has potential as an analytic technique for identifying counterfeit medicines, the examples are from a laboratory environment and do not show how NQR might be used in the field.

It is therefore an aim of the present invention to present a practical system using NQR for medicine authentication and counterfeit detection. Evidently, some of the methods and apparatus described will have wider applicability and be usable with analytical techniques other than NQR, such as those based on Raman Spectroscopy, Spatially-Offset Raman Spectroscopy, Near-Infrared Spectroscopy, Terahertz Spectroscopy, or X-ray.

According to a first aspect of the invention there is provided a method of authenticating an article, the method comprising: reading a label associated with the article, the label comprising article fingerprint information; retrieving, in dependence on the article fingerprint information, an article fingerprint, the fingerprint describing the expected resonance response of the article to an excitation signal; applying an excitation signal to the article; receiving the resonance response of the article to the excitation signal; comparing the resonance response to the fingerprint; and determining in dependence on the comparison whether the article is authentic.

Preferably, the fingerprint is encoded in the label.

Preferably, the fingerprint information enables retrieval of the fingerprint from a remote location. This may provide additional security, for example by requiring knowledge of where the fingerprint is to be retrieved, requiring additional security credentials to be supplied and/or enabling the fingerprint to be easily updated.

The remote location may be accessible over a computer network location. For example, the fingerprint may be stored at one or more remote computer servers, commonly referred to as being stored "in the cloud".

Preferably, a plurality of fingerprints is associated with the article and the fingerprint information identifies a specific fingerprint. This may provide further security. Also, this may provide ease of operation by allowing multiple fingerprints to be generated ahead of the time when they will be required.

Preferably, the fingerprint information identifies an excitation signal parameter to be applied. This may provide a further level of security.

Preferably, the excitation signal parameter is encoded in the label, fingerprint information or fingerprint.

Preferably, the excitation comprises a pulse sequence, comprising a plurality of radiofrequency (RF) pulses.

Preferably the resonance response is a nuclear quadruple resonance (NQR).

Preferably, the excitation comprises a multi-pulse pulse sequence, more preferably a pulsed spin-locking sequence.

Preferably, the fingerprint is dependent on at least one of the following response characteristics: line frequency, temperature coefficient, spin-lattice relaxation time ($T_1$), $T_2^*$/linewidth, lineshape, $T_{2e}$ and signal intensity.

Preferably, the fingerprint is configured to be dependent on both extrinsic and intrinsic properties of the article.

Preferably, the label is associated with the article at the time of manufacture of the article.

Preferably, the excitation used for authentication is applied to the article in the same configuration as was used to determine the fingerprint.

Preferably, the label is located on or proximate to the article.

Preferably, the label is part of a container containing the article.

Preferably, the fingerprint comprises an image, spectrum or spectral plot of the expected resonance response. This may allow for ease of operation, allowing a direct comparison of fingerprint and acquired signal.

Preferably, the fingerprint comprises a string of acceptable values for some or all of the response characteristics.

Preferably, the article is a medicament or pharmaceutical. The medicament or pharmaceutical may be in the form of: a powder, a single pill, caplet or capsule, an oral suspension. The medicament or pharmaceutical may be in the form of: a packaged product containing the medicament or pharmaceutical, a number of packaged pills, caplets or capsules in a blister pack, cardboard packet or bottle. The article may be a raw material used in making a pharmaceutical. The article may be an agrochemical.

According to another aspect of the invention there is provided a method of tagging or labelling an article, the method comprising: applying an excitation signal to the article, the signal being determined by a plurality of parameters; measuring the resonance response of the article to the excitation signal; generating, in dependence on the response, an article fingerprint; and generating a label for the article, the label comprising information regarding the parameters used for the excitation signal on which the fingerprint is based.

Preferably, the excitation is an RF excitation and the resonance response is a nuclear quadruple resonance (NQR).

Preferably, the excitation comprises a pulse sequence.

Preferably, the series differ in at least one of: number of pulses, pulse spacing ($2\tau$).

According to another aspect of the invention there is provided a method of determining the distance of an article from an antenna, the method comprising: applying via the antenna an excitation signal in the form of a pulse sequence to the article, the sequence comprising: i) a pulse of a first kind; ii) a series of pulses of a second kind; and ii) a pulse of a third kind interposed between a pair of pulses of the second kind, the pulse of the third kind affecting the response of the article to subsequent pulses in dependence on the distance of the article from the antenna; comparing the resonance response of the article due to the first member of a pair of pulses of the second kind with that due to the second member of the pair of pulses of the second kind; and determining from the comparison the distance of the article from the antenna.

Preferably, the comparison of resonance responses comprises determining the difference in phase of the responses.

Preferably, the pulse sequence further comprises a second pulse of the third kind applied before a third pulse of the second kind; comparing the resonance response of the article further comprises comparing the response due to the first member of the pair of pulses of the second kind with that due to the second member of the pair of pulses of the second kind and the third pulse of the second kind; and determining from the comparison the distance of the article from the antenna.

Preferably, the method further comprises comparing the resonance responses with predetermined data on the relative phases of the resonance responses due to the pulses a function of distance between the article and the antenna.

According to another aspect of the invention there is provided apparatus for authenticating an article, the method comprising: means for reading a label associated with the article, the label comprising article fingerprint information; means for retrieving, in dependence on the article fingerprint information, an article fingerprint, the fingerprint describing the resonance response of the article to an excitation signal; means for applying an excitation signal to the article; means for receiving the resonance response of the article to the excitation signal; means for comparing the resonance response to the fingerprint; and means for determining in dependence on the comparison whether the article is authentic.

According to another aspect of the invention there is provided apparatus for tagging or labelling an article, the method comprising: means for applying an excitation signal to the article, the signal being determined by a plurality of parameters; means for measuring the resonance response of the article to the excitation signal; means for generating, in dependence on the response, an article fingerprint; and means for generating a label for the article, the label comprising information regarding the parameters used for the excitation signal on which the fingerprint is based.

According to another aspect of the invention there is provided apparatus for determining the distance of an article from an antenna, the method comprising: means for applying via the antenna an excitation signal in the form of a pulse sequence to the article, the sequence comprising: i) a pulse of a first kind; ii) a series of pulses of a second kind; and ii) a pulse of a third kind interposed between a pair of pulses of the second kind, the pulse of the third kind affecting the response of the article to subsequent pulses in dependence on the distance of the article from the antenna; means for comparing the resonance response of the article due to the first member of a pair of pulses of the second kind with that due to the second member of the pair of pulses of the second kind; and means for determining from the comparison the distance of the article from the antenna.

The invention may provide one or more of the following features:
 a method of authenticating an article comprising the steps of: retrieving a reference response to a resonance-Inducing excitation obtained from a known article by means of a label or tag; measuring a response to the resonance-inducing excitation obtained from an unknown article; comparing the response from the unknown article to the reference response; and identifying the unknown article as the known article by comparing the response from the unknown article to the reference response.
 the tag may be provided on or proximate to the unknown article or a container of the unknown article.
 the tag may comprise an encrypted code denoting or providing access to the reference response.
 the resonance-inducing excitation may excite Nuclear Quadruple Resonance (NQR).
 the known article may be a medicament that is authentic and the unknown article is not determined to be authentic if the response from the unknown article is not substantially identical to the reference response.
 a method of correcting a measurement by a device, the measurement being a response to a resonance-inducing excitation, the excitations comprising pulses, from an article comprising the steps of: receiving a resonance-inducing excitation response from the article from a pulse sequence comprising a first pulse, a second pulse and a third pulse, wherein the second pulse follows the first pulse and the third pulse follows the second pulse; comparing the response from the article due to the first pulse with the response due to the third pulse; applying a correction to the measurement of the response from the article in dependence on a pre-determined relationship between a phase difference between the first pulse and the third pulse.

the correction to the measurement of the response may be applied to the signal intensity of the response due to a distance between the article and an antenna of the device and/or due to temporal parameters of the first, second and/or third pulses.

the pre-determined relationship may be that the distance between the article and the antenna is known when a radiofrequency field of the resonance-inducing excitation is inverted after the second pulse is applied.

the pre-determined relationship may be the relationship between the phase difference between the first pulse and the second pulse and the distance from the article to the antenna.

the first pulse and the third pulse may be substantially equivalent with regards to the pulse duration and/or the pulse intensity.

a method of securely tagging an article for authentication, comprising the steps of: generating, using a set of parameters, a reference response for identifying the article, the reference response being generated by measuring a resonance-inducing excitation response from the article; encoding a tag with the set of parameters or directions for retrieving the set of parameters; associating the tag and/or the set of parameters with the reference response; tagging the and/or another equivalent article with the tag.

an optional step of authenticating the article by retrieving the set of parameters by means of the tag in dependence upon generating a resonance-inducing excitation response from the article for comparison with the reference response.

the set of parameters may comprise at least one of the number of pulses of the resonance-inducing excitation and/or the time between pulses.

an optional step of differentiating between a first batch of the article and second batch of the article using a first set of parameters associated with the first batch and a second set of parameters associated with the second batch.

Further features of the invention are characterised by the dependent claims.

The invention extends to methods and/or apparatus substantially as herein described and/or as illustrated with reference to the accompanying drawings.

The invention also provides a computer program and a computer program product for carrying out any of the methods described herein and/or for embodying any of the apparatus features described herein, and a computer readable medium having stored thereon a program for carrying out any of the methods described herein and/or for embodying any of the apparatus features described herein. The invention also provides a signal embodying a computer program for carrying out any of the methods described herein and/or for embodying any of the apparatus features described herein, a method of transmitting such a signal, and a computer product having an operating system which supports a computer program for carrying out any of the methods described herein and/or for embodying any of the apparatus features described herein.

Any apparatus feature as described herein may also be provided as a method feature, and vice versa. As used herein, means plus function features may be expressed alternatively in terms of their corresponding structure, such as a suitably programmed processor and associated memory.

Any feature in one aspect of the invention may be applied to other aspects of the invention, in any appropriate combination. In particular, method aspects may be applied to apparatus aspects, and vice versa. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

Furthermore, features implemented in hardware may generally be implemented in software, and vice versa. Any reference to software and hardware features herein should be construed accordingly.

The present invention is now described, purely by way of example, with reference to the accompanying diagrammatic drawings, in which.

OVERVIEW

Generally, medicine authentication involves assessing whether a purported medicine corresponds to what it is claimed to be, for example, whether it is as described on the label of its packaging.

Medicine authentication using NQR involves matching the NQR response of the purported medicine, acquired during an authentication event, against an expected NQR response or "fingerprint", which has been generated previously from a genuine or authentic version of the medicine.

Figure 2:
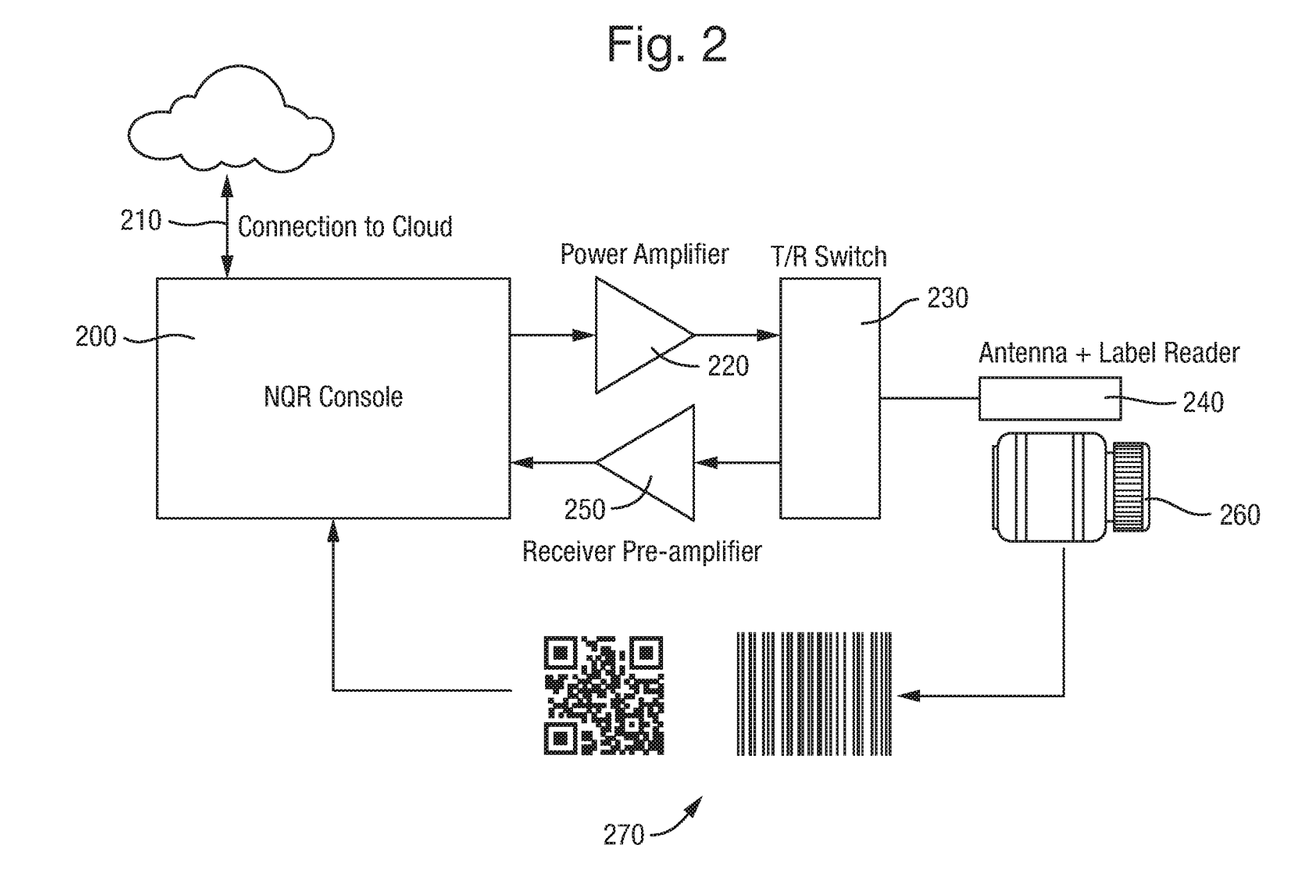
FIG. 2 shows an overview of a medicines authentication system.

FIG. 2 shows an overview of a medicines authentication system, specifically the authentication module. This comprises the following:

NQR console 200

Connection to cloud 210

Power amplifier 220

T/R (transmit-receive) switch 230

Antenna and label reader 240

Receiver pre-amplifier 250

Also shown is a container 260 of medicine undergoing the authentication process and the label/fingerprint 270 being used for authentication.

Figure 3:
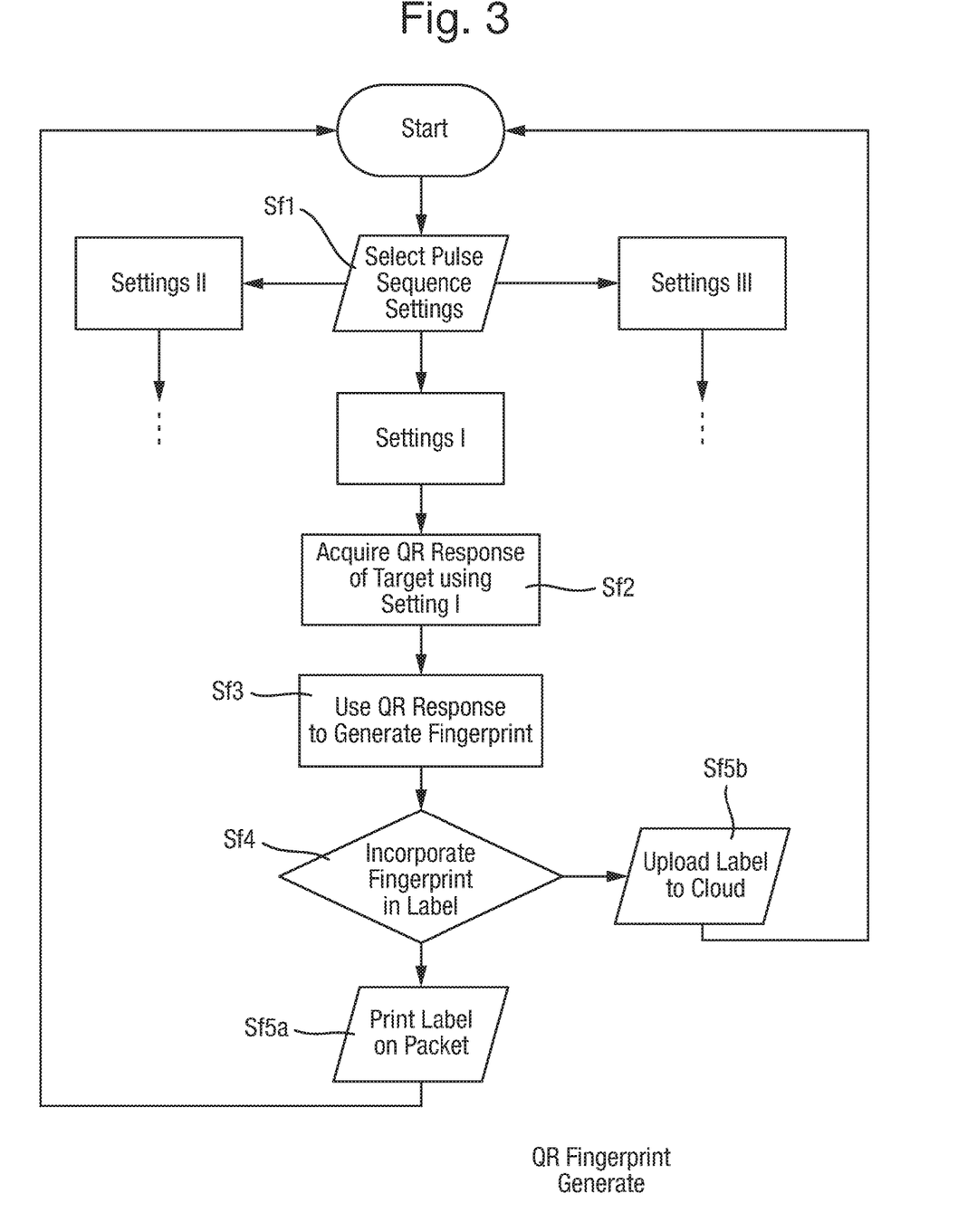
FIG. 3 is a flowchart describing the operation of the fingerprinting stage of the medicines authentication system.

FIG. 3 shows a flowchart describing the operation of the fingerprinting stage of the medicines authentication system.

Figure 4:
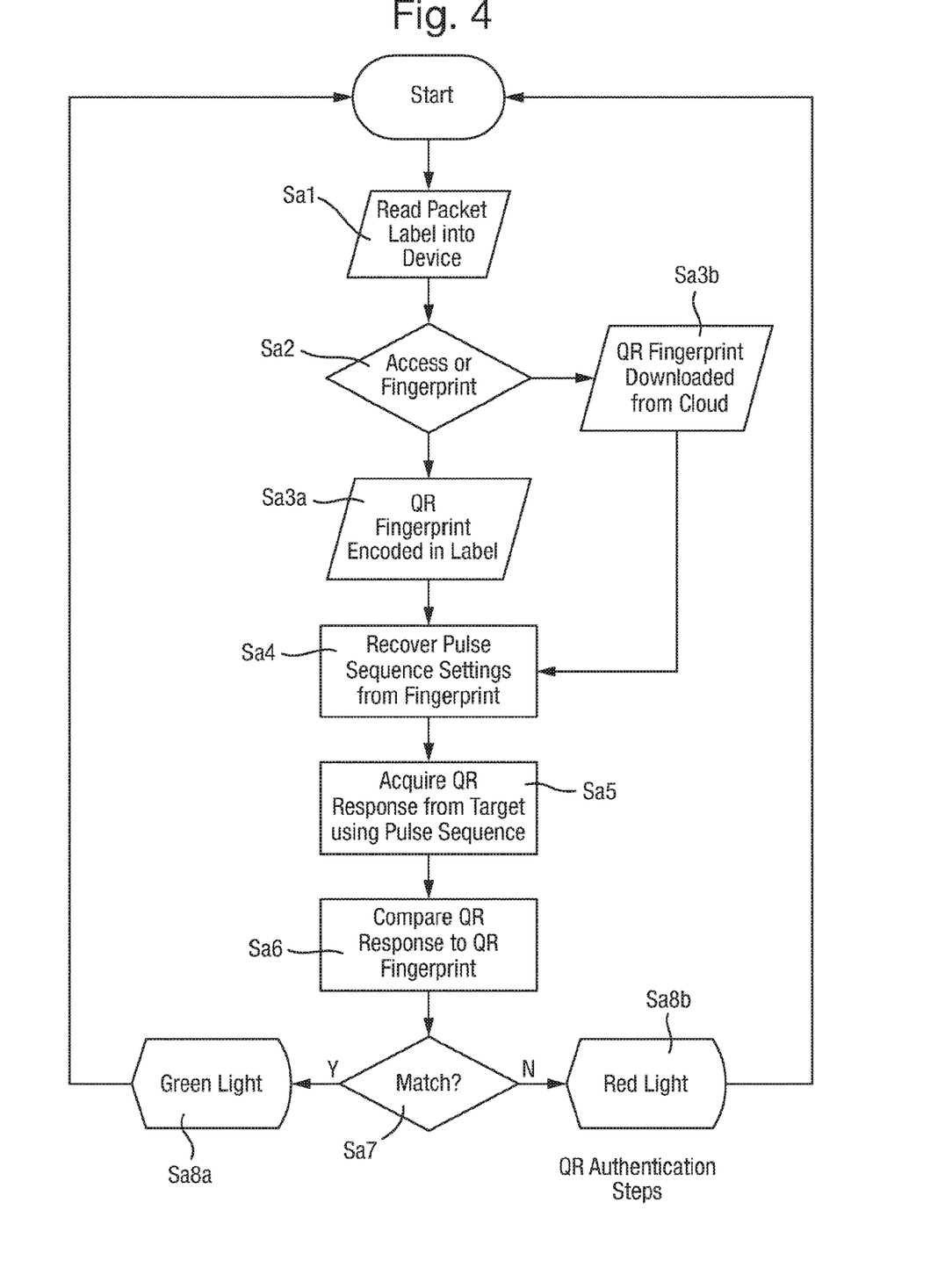
FIG. 4 is a flowchart describing the operation of the authentication stage of the medicines authentication system.

QR fingerprint generator
Sf1. Select pulse sequence settings i, ii or iii
Sf2. Acquire QR response of target using chosen setting
Sf3. Use QR response to generate fingerprint
Sf4. Incorporate fingerprint in label
Sf5. a) print label on packet
   OR b) upload label to cloud FIG. 4 shows a flowchart describing the operation of the authentication stage of the medicines authentication system.

QR Authentication steps
   Sa1. Read packet label into device
   Sa2. Access QR fingerprint
   Sa3. EITHER a) QR fingerprint encoded in label
        OR b) QR fingerprint downloaded from cloud
   Sa4. Recover pulse sequence settings from fingerprint
   Sa5. Acquire QR response from target using pulse sequence
   Sa6. Compare response to QR fingerprint
   Sa7. Match?
   Sa8. EITHER a) Yes green light
        OR b) No=>red light NQR Fingerprint The fingerprint may be generated from the medicine in various forms, for example as a powder, a single pill, caplet or capsule, an oral suspension, or as a packaged product containing the medicine, for example a number of packaged pills, caplets or capsules in a blister pack, cardboard packet or bottle.

Ideally, the NQR response that is used for authentication is generated in the same configuration in which the fingerprint was generated. For example, the response of a single pill is compared with the fingerprint of a single pill, rather than against the fingerprint of a plurality of pills or packaged pill(s).

The fingerprint is typically derived from at least some of the following measureable and quantifiable characteristics of an NQR response, whether intrinsic to the material or resulting from a convolution of intrinsic and one or more extrinsic properties, eg. sample processing, pulse sequence parameters and/or amount of material present:

| Characteristic | Origin of the characteristic |
| --- | --- |
| Line frequency<br>Temperature coefficient (Hz/K)<br>Spin-lattice relaxation time: $T_1$<br>Spin-Spin relaxation time: $T_2$ | Intrinsic to the material |
| $T_2^*$/linewidth<br>lineshape | intrinsic characteristic of the material + sample processing (e.g. pressure applied in creating pill) |
| $T_{2e}$ | intrinsic characteristic of the material + pulse sequence parameters |
| signal intensity | intrinsic characteristic of the material + amount of material present + pulse sequence parameters |

An NQR response generally comprises a number of spectral lines, corresponding to frequencies, so there is a choice of which are used in defining the fingerprint.

$T_1$ and $T_2$ each require a series of experiments to measure and thus are unlikely to be a direct part of the fingerprint (albeit that $T_1$ and $T_2$ are present indirectly in $T_{2e}$ and $T_2$).

$T_{2e}$ denotes a time constant associated with the decay in signal across the entire echo train of an NQR response; $T_2^*$ is a time constant associated with the decay in signal of individual echo.

Knowledge of temperature is required for use of frequency information allied to the temperature coefficient, as line frequency, $T_1$, $T_2$ and $T_{2e}$ are temperature dependent.

In some embodiments, the fingerprint comprises an image of the expected NQR response (e.g. the spectrum or a spectral plot) and a direct comparison is made between the NQR response acquired during the authentication event and the fingerprint.

More likely, the fingerprint comprises a string of acceptable values for some or all of the response characteristics and a comparison is made with the corresponding values extracted by signal processing from the NQR response acquired during the authentication event.

The signal processing is similar to that used for determining whether an NQR signal is real or merely due to radio-frequency interference, based on measuring the same characteristics.

The following table shows typical characteristics of two different medicines, paracetamol tablets and sulfadiazine powder:

| Characteristic | Paracetamol tablets | Sulfadiazine powder |
| --- | --- | --- |
| Frequency (of spectral lines at 294 K)/kHz | 2563.2 | 2563.7 |
| Temperature coefficient/Hz/K | 40 | 90 |
| $T_2^*$/ms | 0.18 | 0.16-0.55 |
| $T_1$/s | 6 s | 9 s |
| $T_{2e}$/ms (at $2\tau$ = 2.4 ms) | 450 | 2300 |
| T2StarEst (estimated $T_2^*$) | 1.65E-04 | 2.32E-04 |
| etDampEst (estimated $1/T_{2e}$) | 2.55E-06 | 9.56E-05 |
| dampest (estimated $1/T_2^*$) | 0.036 | 0.207 |
| T2effEst (estimated $T_{2e}$) | 2.361 | 0.502 |

As can be seen, at room temperature the NQR spectral lines of the two medicines are of very similar frequency. This means that they would not by themselves make for a good fingerprint. Typically, therefore, the fingerprint is built from multiple characteristics of the NQR response.

Although other lines in the spectra, which are not at the same frequencies, could be used for the fingerprint, this may not be necessary if there are other characteristics (e.g. in this case $T_{2e}$) which are sufficiently different so as to be discernible.

Acquiring the NQR Response

Time is a factor in authentication. In order to authenticate medicines quickly, a pulse sequence, comprising a plurality of radiofrequency pulses is used as this will allow the signal processing to extract from the NQR response all the characteristics needed to compare against the fingerprint in a "single shot".

The following table shows characteristics that can be extracted in a single shot from different classes of pulse sequence:

| Class of pulse sequence | "single shot" characteristics |
| --- | --- |
| Single pulse (stochastic) | Frequency, $T_2^*$, lineshape, signal intensity |
| Pulsed spin-locking multiple-pulse | Frequency, $T_2^*$, $T_{2e}$, lineshape, signal intensity |
| Steady-state multiple pulse | Frequency, $T_2^*$, lineshape, signal intensity |

In practice—as time is an issue—multiple-pulse pulse sequences are favoured for producing responses good signal-to-noise ratios (SNR) in a small amount of time.

Furthermore, as steady-state sequences work only within certain ranges of $T_1$ and $T_2^*$, mostly, but not exclusively, a pulsed-spin locking sequence is used.

Figure 5:
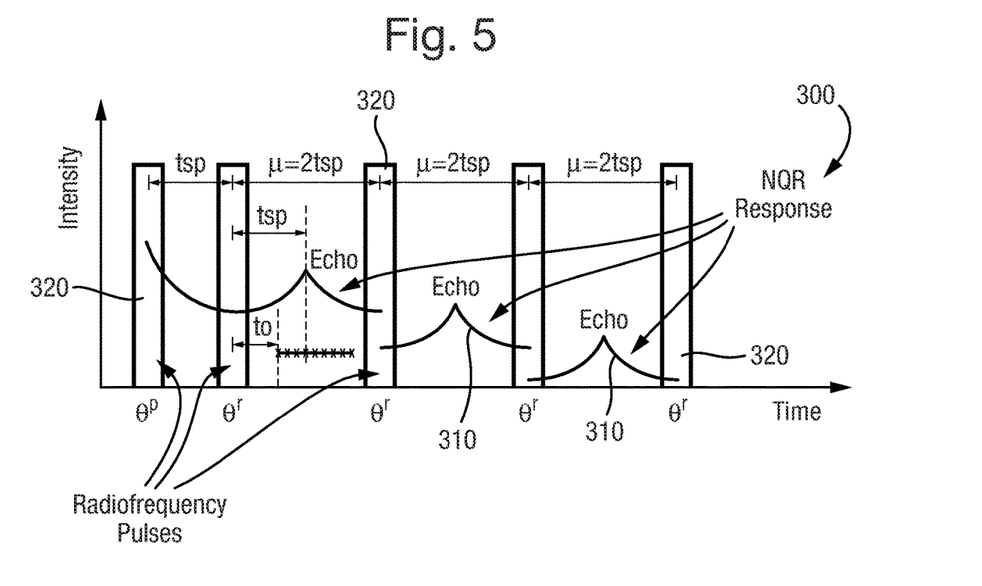
FIG. 5 is a schematic of a pulsed-spin locking excitation sequence and the resulting NQR response.

FIG. 5 is a schematic of a pulsed-spin locking excitation sequence and the resulting NQR response, showing the time-dependent signal intensity of a) excitation radiofrequency pulses 320 generated during an authentication event, and b) the resulting NQR response 300, comprising echoes 310 (the plurality of sequential echoes 310 defining an "echo train").

Figure 6:
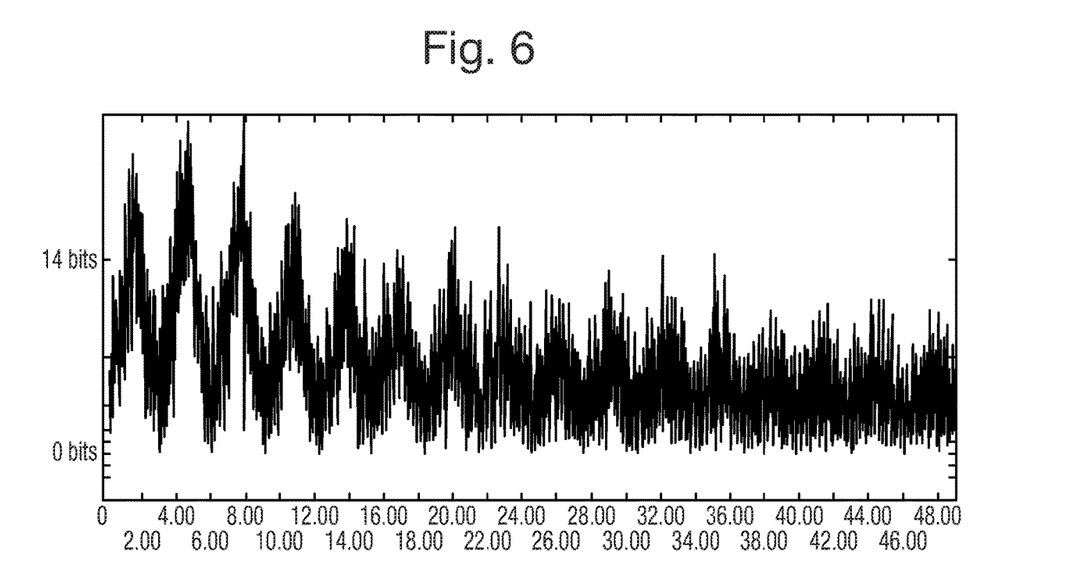
FIG. 6 shows an actual time domain NQR response generated from a pulsed spin-locking multiple-pulse sequence.

FIG. 6 shows an actual time domain NQR response generated from a pulsed spin-locking multiple-pulse sequence, from which frequency, signal intensity $T_2^*$ and $T_{2e}$ and lineshape may be determined.

While the response frequency and $T_2^*$ are independent of the pulse sequence, i.e. the duration, intensity and/or relative "timings" of the radiofrequency pulses, both the response signal intensity and $T_{2e}$ are heavily influenced by these timings; most particularly, the values of these characteristics decrease with increasing time between the radiofrequency pulses. This allows for a further level of security to be introduced into the authentication system by way of Pulse Sequence Encoding.

Pulse Sequence Encoding

As mentioned previously, the value of certain measurable characteristics of the NQR response are influenced by features of the pulse sequences used ie. the selection choices made regarding eg. number of pulses, time between successive pulses (pulse spacing) etc. The same material, present in the same quantity may return different values for $T_{2e}$ and/or signal intensity depending on these selection choices, while $T_2^*$ and line frequency are unaffected.

Figure 7:
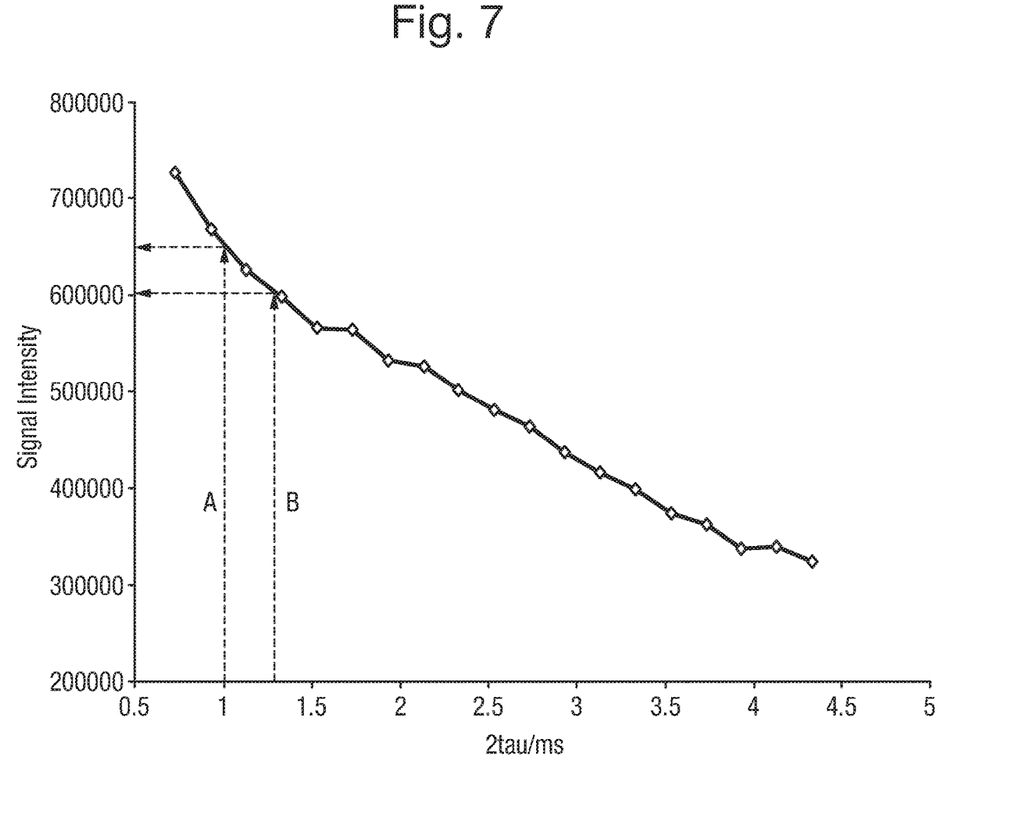
FIG. 7 shows an example of how the NQR response is dependent on the excitation pulse sequence.

FIG. 7 shows an example of how the NQR response is dependent on the excitation pulse sequence. For two different pulsed spin-locking sequences A and B, where sequence A has a lower pulse spacing (known as $2\tau$ in pulsed spin-locking sequences) than sequence B, the same material present in the same quantity returns a higher signal intensity response for sequence A than for sequence B.

Hence, first a fingerprint for a first batch of a medicine may be generated using sequence "A" and a second fingerprint for a second batch of the same medicine (i.e. same manufacturer, same product and same packaging) produced, for example, on a different day, is generated using sequence "B".

By encoding information regarding which sequence (A or B) was used into the label or tag, the authentication device would be able to reproduce correctly the conditions used to generate the fingerprint specific to that batch—and hence identify the batch.

A change would also observed in $T_{2e}$ between the fingerprints generated using the two different sequences.

Other types of encoding which could be used, such as changing the number of pulses in the sequence, would affect signal intensity but not $T_{2e}$.

Even if a counterfeiter were able to measure the intrinsic NQR characteristics of a medicine in an attempt to fake parts of a fingerprint (e.g. line frequency, $T_2^*$), they would not know the necessary details of the pulse sequence which had been used and so be unable to recreate the whole fingerprint.

Distance Correction

Another factor which influences the values of the characteristics which may form the fingerprint is effect of the distance between the antenna and the material being measured.

Effectively, the authentication device used to acquire the NQR response (for generating the fingerprint and/or for performing an authentication event) may be considered to operate in two modes:
 in a first mode, the pill or packaged medicine is dropped into the radiofrequency coil of the authentication device which surrounds it
 in a second mode, where the authentication device comprises a unilateral antenna brought up to the side of the pill or packaged medicine.

In the latter mode the effect of the distance between the antenna and material being measured affects the NQR response, in particular the intensity characteristic.

The difficulty arises when using a unilateral antenna on a sample of medicine in a sealed box, where it can be difficult to know the distance from the antenna to the sample.

As the intensity of both the radiofrequency field ($B_1$) and the measured NQR response decrease with distance, when the distance from the antenna to the sample is unknown, it is difficult to know from an NQR response if the amplitude of the signal acquired is due to there being a small amount of the sample close to the antenna, or a large amount of the sample further away. This can make it difficult to conduct quantitative medicine authentication.

The problem may be solved by exploiting the drop-off in the $B_1$ field with distance to encode the NQR response in such a way that the true signal intensity, corresponding to zero distance between antenna and sample, may be calculated independently of the distance between the antenna and sample, based on a graph of distance from coil versus correction factor.

Preferably, the solution:
 gives information on distance to the sample in a single measurement
 uses a preferred pulse sequence
 does not suffer any reduction in signal-to-noise ratio compared to a non-encoded version of a preferred pulse sequence FIG. 8 shows schematic representations of Distance-Sensitive Pulse Spin-Locking (DSPSL) phase-encoded sequences.

Figure 8A:
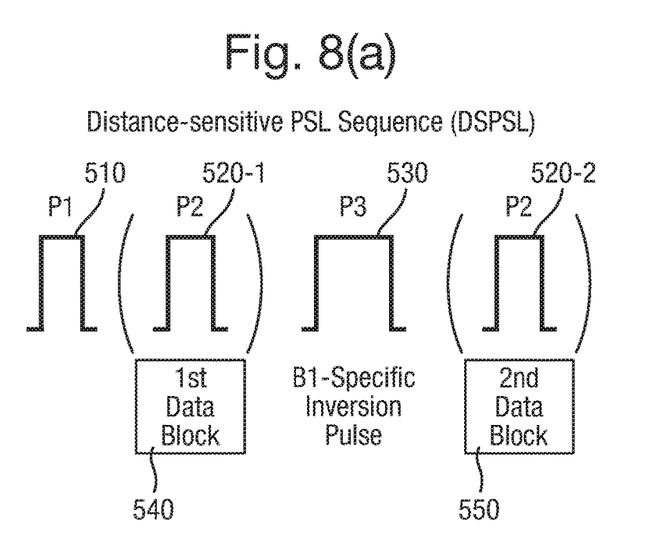
FIG. 8 shows schematic representations of Distance-Sensitive Pulse Spin-Locking (DSPSL) phase-encoded sequences.

FIG. 8(a) shows a two-block DSPSL pulse sequence, comprising the pulsed spin-locking sequence:

$$P1_{\pm x}-(\tau-P2_{+y}-\tau-)_n,$$

where pulses P1 and P2 are of phase +x, −x or +y; $\tau$ is a time period between pulses; and n is the number of times the combination of delays $2\tau$ and P2 are repeated.

A third class of pulse—P3—is inserted midway in the trains of P2 pulses, such that:

$$P1_{\pm x}-(\tau-P2_{+y}-\tau-)_{n/2}-\tau^1-P3_{\mp x}-\tau^1-(\tau-P2_{+y}-\tau-)_{n/2}$$

where $\tau^1=[\tau-(P3-P2)]$ in order to keep the time between the pulses at $2\tau$.

Applying the resulting encoded PSL sequence, signals acquired before pulse P3—in "block one" 540—are compared to those acquired after pulse P3—in "block two" 550.

The difference in phase between the signals acquired in the first data block 540 and those acquired in the second data block 550 is dependent on the flip angle of pulse P3 530.

The flip angle of P3 is in turn dependent on the duration of P3 and the $B_1$ field at the sample.

If the pulse duration is fixed for a given authentication event, then the B1 field to which the sample is exposed is dependent upon the distance of the sample from the unilateral antenna (in the absence of RF shielding between sample and antenna).

Thus the encoded DSPSL pulse sequence can be used to determine the distance of a sample from the unilateral antenna via a comparison of the phase of the signals in the first data block 540 (associated with the second pulse (P2) 520-1) to that of the signals in the second data block 550 (associated with a subsequent P2 pulse 520-2).

The phase of the signal in the second data block 550 will be inverted with respect to that of the signal in the first data block 540 only when the sample is at a distance from the coil where the $B_1$ field is such that the connecting P3 pulse 530 acts as an inversion pulse; at all other distances the phase difference will be something other than 180 degrees.

The P3 pulse 530 need not be halfway along the train of pulses; it can be placed at any point. It would, however, be desirable to place it as late in the train as possible to maximize the SNR acquired from the signals acquired before the P3 pulse.

There is further advantage in using two (or more) P3 pulses for a finer degree of distance information, as described below.

Figure 8B:
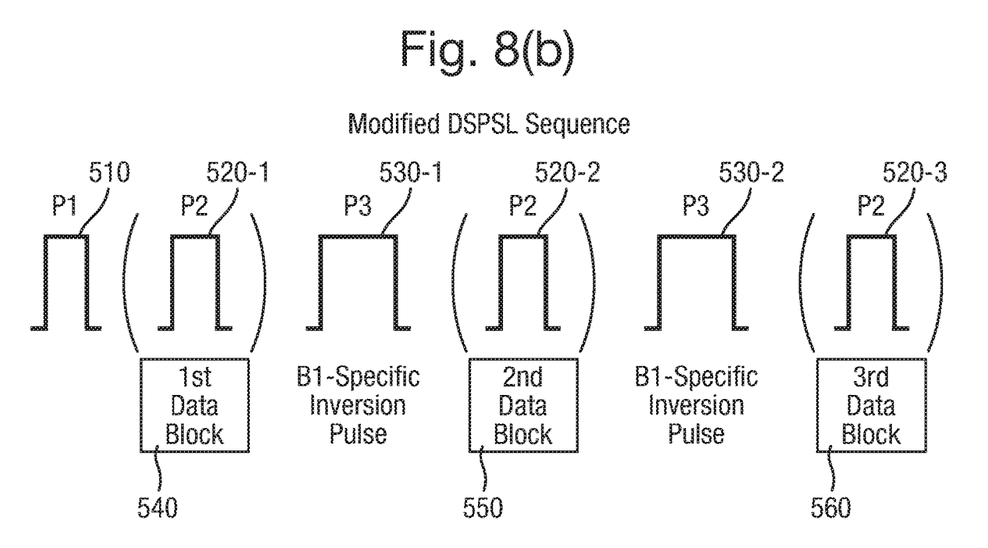

FIG. 8(b) shows a three-block DSPSL pulse sequence. This is essentially the two-block DSPSL sequence described above modified through the introduction of a second P3 $B_1$-specific inversion pulse 530-2 and a third data block 560. Thus any magnetization knocked out of the xy plane by a first P3 pulse 530-1 will be brought back into the xy plane by the second P3 pulse 530-2.

FIG. 9 shows NQR responses using three-block DSPSL phase-encoded sequences, in this example from paracetamol pills placed 5 mm above the surface of the unilateral antenna.

Typically, whole echo trains are acquired for signal averaging; however, for clarity, here only the envelope of the echo train is shown (i.e. the data points have been averaged down to a single data point per echo) to allow the phase of the signal in each data block to be directly compared without the need for further signal processing.

Different numbers of echoes have been acquired in each block to illustrate different possible configurations of the sequence. The second 550 and third 560 blocks are primarily not to provide signal, but to provide distance information via the phase changes in the signals from first 540 to second 550 to third 560 blocks.

Figure 9A:
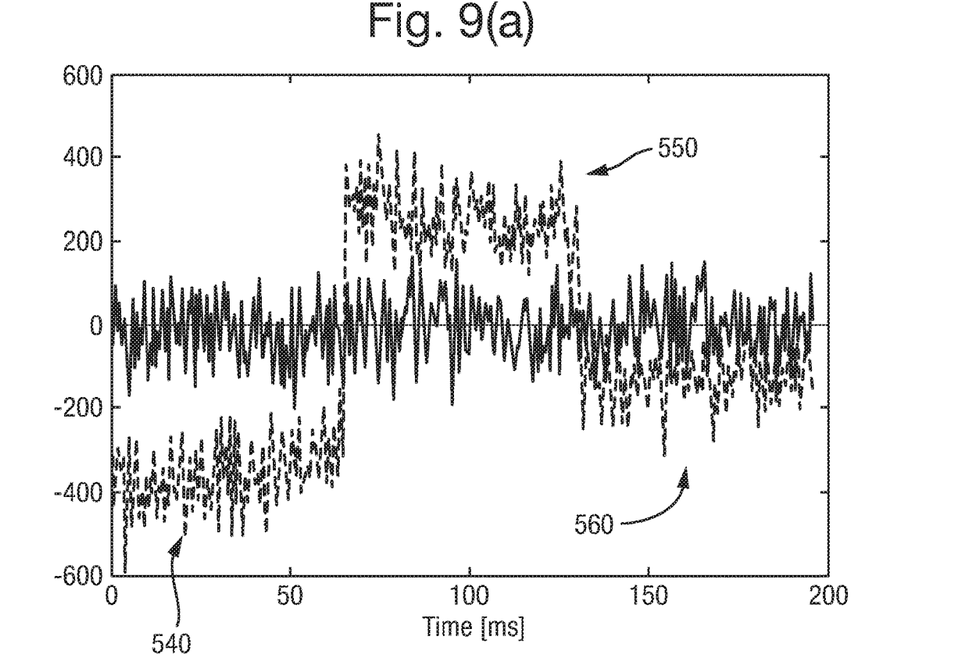
FIG. 9 shows NQR responses using three-block Distance-Sensitive Pulse Spin-Locking (DSPSL) phase-encoded sequences.

FIG. 9(a) shows a time-domain echo train with a single data point per echo (128 echoes per block).

Figure 9B:
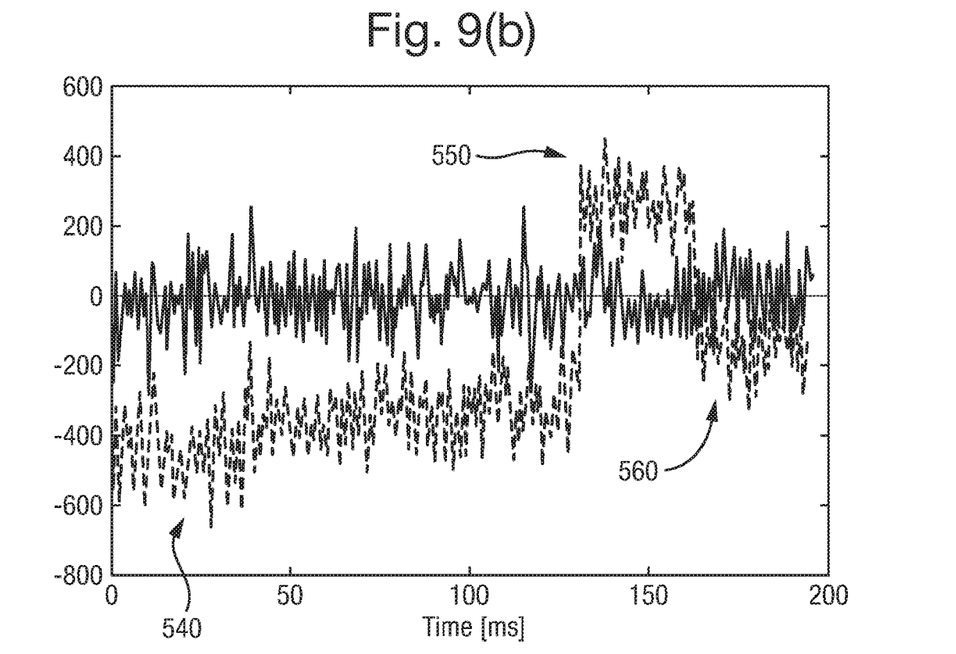

FIG. 9(b) shows a time-domain echo train with a single data point per echo (256 echoes in the first block 540 and 64 echoes in the second block 550 and third blocks 560). The number of echoes in each of the second and third blocks is a quarter of that in the first block, so there is greater $T_{2e}$ decay going from the first block to second block etc. This is considered the optimal set-up provided the SNR is sufficient in the second and third blocks to allow the phase to be measured.

Figure 10:
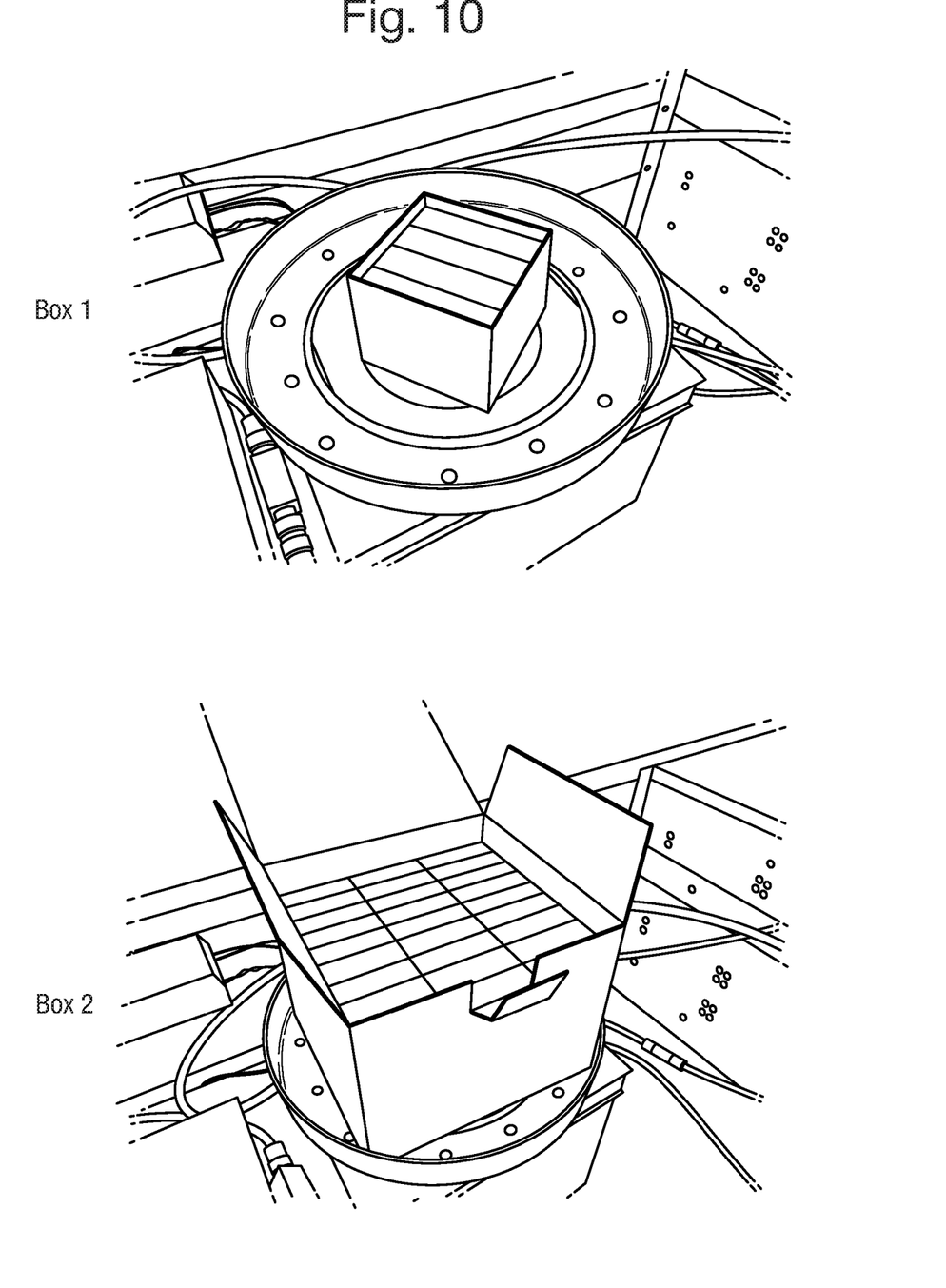
FIGS. 10 and 11 show an example of NQR responses being used to determine the distance of a sample.
Figure 11:
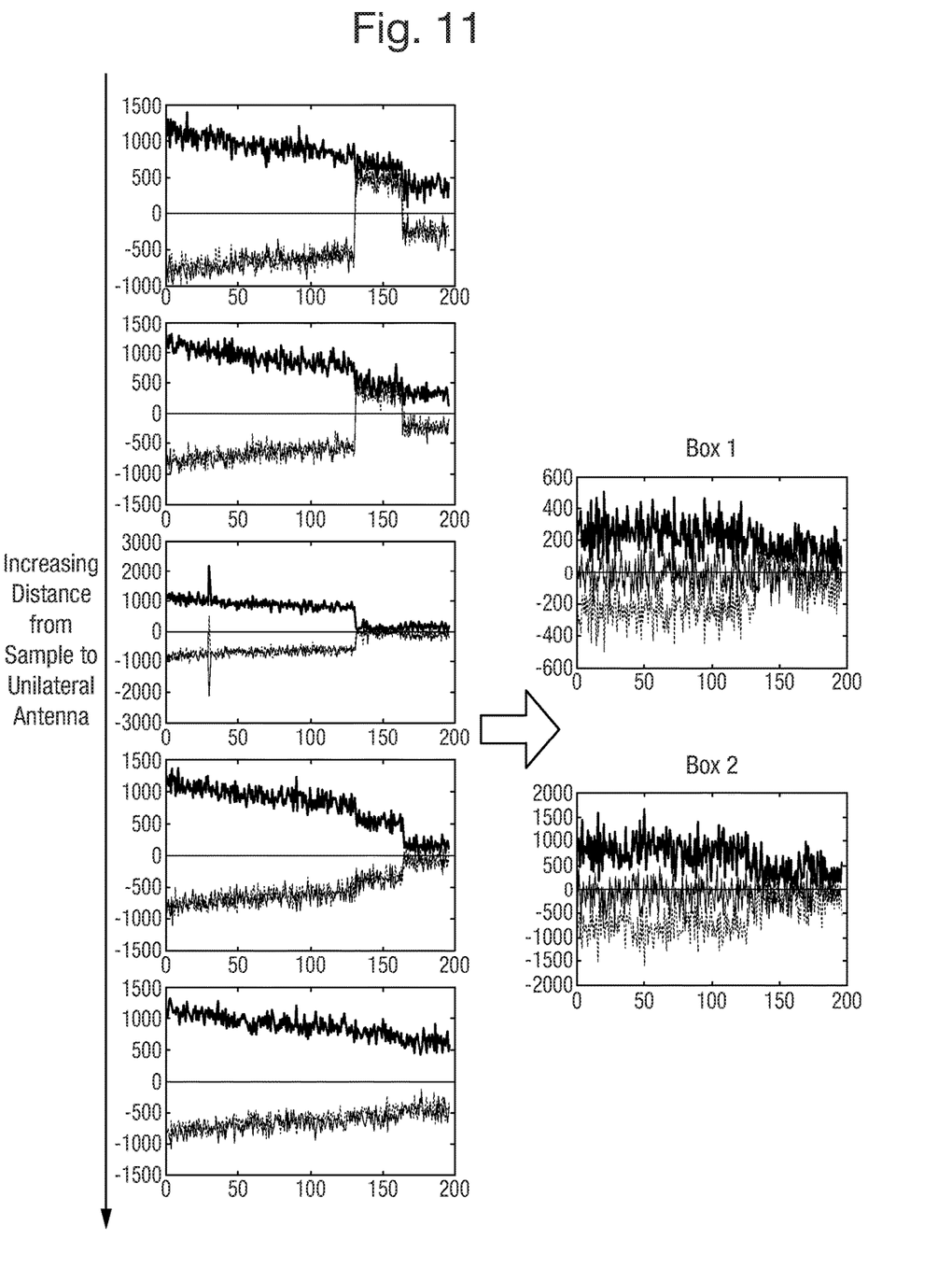

FIGS. 10 and 11 show an example of NQR responses being used to determine the distance of a sample.

FIG. 10 shows two boxes Box 1 and Box 2 of sample medicine (boxes of pills) in two different arrangements with respect to the antenna.

FIG. 11 shows NQR echo train envelopes of:
i) on the left, the signals returned by the DSPSL sequence with the sample placed progressively further away from the antenna;
ii) on the right, the signals returned by the DSPSL sequence with the two boxes A and B.

By varying the distance of the sample from the antenna, it is possible to build a chart of the relative phase between the three blocks with increasing distance between the sample and the antenna. This chart is then used to estimate the position of the sample in the two different boxes.

A comparison of the plots on the right with those on the left indicates that the pills in the second box, Box 2 are further from the antenna than the pills in the first box, Box 1—in this case this is due to the second box being made of thicker cardboard being too big to fit within the rim of the shield plate, meaning it cannot be placed directly on the Perspex covering the antenna Alternatives and Modifications Alternative embodiments may use techniques other than NQR, for example: X-rays; NMR; THz radiation; Raman scattering; near infrared radiation; information on the granularity or colour of a medicine under different wavelengths of light; and/or chromatographic techniques.

In some embodiments pulses of other function and/or design for pulse P3 are used, for example sequences that place P3 in different places along the train and/or which use different numbers of P3 pulses.

It will be understood that the present invention has been described above purely by way of example, and modifications of detail can be made within the scope of the invention.

Each feature disclosed in the description, and (where appropriate) the claims and drawings may be provided independently or in any appropriate combination.

Reference numerals appearing in the claims are by way of illustration only and shall have no limiting effect on the scope of the claims.

The invention claimed is:

1. A method of authenticating an article, the method comprising:
   reading a label associated with the article, the label comprising article fingerprint information;
   retrieving, in dependence on the article fingerprint information, an excitation signal parameter and an article fingerprint, the fingerprint describing a resonance response of the article to an excitation signal associated with the excitation signal parameter;
   applying an excitation signal associated with the excitation signal parameter to the article;
   receiving the resonance response of the article to the excitation signal;
   comparing the resonance response of the article to the resonance response described by the fingerprint; and
   determining in dependence on the comparison whether the article is authentic.

2. The method according to claim 1, wherein the fingerprint is encoded in the label.

3. The method according to claim 1, wherein the fingerprint information enables retrieval of the fingerprint from a remote location.

4. The method according to claim 1, wherein a plurality of fingerprints is associated with the article and the fingerprint information identifies a specific fingerprint.

5. The method according to claim 1, wherein the excitation signal parameter is encoded in the label, fingerprint information or fingerprint.

6. The method according to claim 1, wherein the excitation comprises a pulse sequence, comprising a plurality of radiofrequency (RF) pulses.

7. The method according to claim 6, wherein the resonance response is a nuclear quadruple resonance (NQR).

8. The method according to claim 7, wherein the excitation comprises a multi-pulse pulse sequence.

9. The method according to claim 8, wherein the excitation comprises a pulsed spin-locking sequence.

10. The method according to claim 7, wherein the fingerprint is dependent on at least one of the following response characteristics: line frequency, temperature coefficient, spin-lattice relaxation time ($T_1$), $T_2$*/linewidth, lineshape, Tee and signal intensity.

11. The method according to claim 1, wherein at least one of:
   a) the fingerprint is configured to be dependent on both extrinsic and intrinsic properties of the article;
   b) the label is associated with the article at the time of manufacture of the article;
   c) the excitation used for authentication is applied to the article in the same configuration as was used to determine the fingerprint;
   d) the label is located on or proximate to the article; or
   e) the label is part of a container containing the article.

12. The method according to claim 1, wherein the fingerprint comprises an image, spectrum or spectral plot of the expected resonance response.

13. The method according to claim 1, wherein the fingerprint comprises a string of acceptable values for some or all of the response characteristics.

14. The method according to claim 1, wherein the article is at least one of:
   a) a medicament or pharmaceutical;
   b) a medicament or pharmaceutical in the form of: a powder, a single pill, caplet or capsule, an oral suspension;
   c) a medicament or pharmaceutical in the form of: a packaged product containing the medicament or pharmaceutical, a number of packaged pills, caplets or capsules in a blister pack, cardboard packet or bottle;
   d) a raw material used in making a pharmaceutical; or
   e) an agrochemical.

15. An apparatus for authenticating an article, the apparatus comprising:
   a label reader, for reading a label associated with the article, the label comprising article fingerprint information;
   means for retrieving, in dependence on the article fingerprint information, an excitation signal parameter and an article fingerprint, the fingerprint describing a resonance response of the article to an excitation signal associated with the excitation parameter; and
   an antenna for applying an excitation signal associated with the excitation signal parameter to the article and for receiving the resonance response of the article to the excitation signal;
   wherein the apparatus is adapted to compare the resonance response of the article to the resonance response described by the fingerprint and determine in dependence on the comparison whether the article is authentic.

16. A method of authenticating an article, the method comprising:
   reading a label associated with the article, the label comprising article fingerprint information;
   retrieving, in dependence on the article fingerprint information,
   i) an excitation signal parameter identifying an excitation signal, and
   ii) an article fingerprint describing a resonance response of an authentic article to the excitation signal;
   applying the excitation signal to the article;
   receiving the resonance response of the article to the excitation signal;
   comparing the resonance response of the article to the resonance response described by the fingerprint; and
   determining in dependence on the comparison whether the article is authentic.

* * * * *